US006662305B1

(12) United States Patent
Salmon et al.

(10) Patent No.: US 6,662,305 B1
(45) Date of Patent: Dec. 9, 2003

(54) FAST RE-SYNCHRONIZATION OF INDEPENDENT DOMAIN CLOCKS AFTER POWERDOWN TO ENABLE FAST SYSTEM START-UP

(75) Inventors: Joe H. Salmon, Placerville, CA (US); Andrew Volk, Granite Bay, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/448,326

(22) Filed: Nov. 23, 1999

(51) Int. Cl.[7] ............................ G06F 1/12; G01R 31/28; H04J 3/06
(52) U.S. Cl. ........................ 713/401; 714/731; 370/503
(58) Field of Search ............................ 713/401, 450; 714/731, 744; 370/503; 710/58

(56) References Cited

U.S. PATENT DOCUMENTS

| 5,214,677 | A | * | 5/1993 | Mori .......................... 331/1 R |
| 5,223,755 | A | * | 6/1993 | Richley ........................ 327/12 |
| 5,889,829 | A | * | 3/1999 | Chiao et al. ................. 327/156 |
| 6,259,467 | B1 | * | 7/2001 | Hanna ......................... 347/235 |
| 6,396,887 | B1 | * | 5/2002 | Ware et al. ................... 375/354 |

FOREIGN PATENT DOCUMENTS

JP          02226824 A   *   9/1990   ............. H04J/3/06

OTHER PUBLICATIONS

IBM, Passing Data Stream Across Asynchronous Clock Domains in Scalable Coherent Interface Bus, Nov. 1, 1993, IBM Technical Disclosure Bulletin, vol. 36, pp. 373–376.*

* cited by examiner

*Primary Examiner*—Dennis M. Butler
*Assistant Examiner*—Suresh K Suryawanshi
(74) *Attorney, Agent, or Firm*—Fish & Richardson P.C.

(57) ABSTRACT

A system having several clock domains must have domain clocks properly aligned before powering up from a low-power or power-down mode. The domain clocks can be quickly aligned to enable fast system start-up if the clocks are forced into a rough alignment before a fine alignment process begins. Initially, a phase offset between the domain clocks is determined using a sync pulse, which indicates a location of one of the domain clocks relative to the other domain clock. Next, the domain clocks are forced into a minimum phase offset configuration by phase stalling one of the domain clocks. The phase stalling includes adjusting the pulse width of one of the domain clocks to force the clock into a rough alignment with the other domain clock. Finally, the domain clocks are fine aligned, and the system is placed into a normal power mode.

27 Claims, 9 Drawing Sheets

FAST RE-SYNCHRONIZATION OF INDEPENDENT DOMAIN CLOCKS AFTER POWERDOWN TO ENABLE FAST SYSTEM START-UP

BACKGROUND

This disclosure relates to re-synchronization of the domain clocks after a low-power or power-down mode to enable fast start-up of a system.

A computer often holds current programs and data in a random access memory (RAM). Each Static RAM (SRAM) bit uses four to six transistors in a dual-stable configuration. This configuration can hold data without external assistance, for as long as power is supplied to the circuit. In contrast, each Dynamic RAM (DRAM) bit uses only one transistor and one capacitor. Hence, the manufacturing cost of the DRAM chips is less than the SRAM chips. However, the DRAM must be refreshed many times per second in order to hold its data contents.

The process of refreshing actually slows down the accessing of the data. An optimal cache design can minimize the delay. However, as processor speeds increase, it becomes more difficult for the cache design to compensate for the inherent slowness of the DRAM. With ever increasing operating frequency of central processing units (CPUs), conventional DRAM architectures may soon reach their practical upper limit in operating frequency and bus width.

A Direct Rambus DRAM (RDRAM) system connects one or more Direct RDRAMs together via a common bus. The bus also connects to devices such as microprocessors, digital signal processors (DSPs), graphics processors and application-specific integrated circuits (ASICs). A controller is located at one end. The RDRAMs are distributed along the bus that is connected to a Rambus channel. The bus is parallel terminated at the far end. A two-byte-wide Rambus channel uses a small number of very high speed signals to carry all address, data and control information. Therefore, in some cases, Direct RDRAMs operate at twice the bandwidth of the conventional DRAMs, such as Synchronous DRAMs (SDRAMs).

However, in order to enable fast access to data in Direct RDRAMs, the bus clock and the system clock should be accurately synchronized during high-speed operation. The clocks should also be quickly re-synchronized after power-up from a low-power mode, thus allowing the system to wake up relatively fast. Since the low-power mode, called a "nap" mode, is touted as a mode that allows fast wake up time (on the order of about 100 nanoseconds), a fast re-synchronization of the clocks is essential.

SUMMARY

A phase offset between the domain clocks is determined using a sync pulse, which indicates a location of one of the domain clocks relative to other domain clocks. The domain clocks are forced into a minimum phase offset configuration by phase stalling one of the domain clocks. The phase stalling includes pushing edges of the domain clocks within a pulse width of the sync pulse. The domain clocks are then fine aligned. A signal is issued when the fine alignment is finished.

BRIEF DESCRIPTION OF THE DRAWINGS

Different aspects of the disclosure will be described in reference to the accompanying drawings wherein.

DETAILED DESCRIPTION,.

Figure 1:
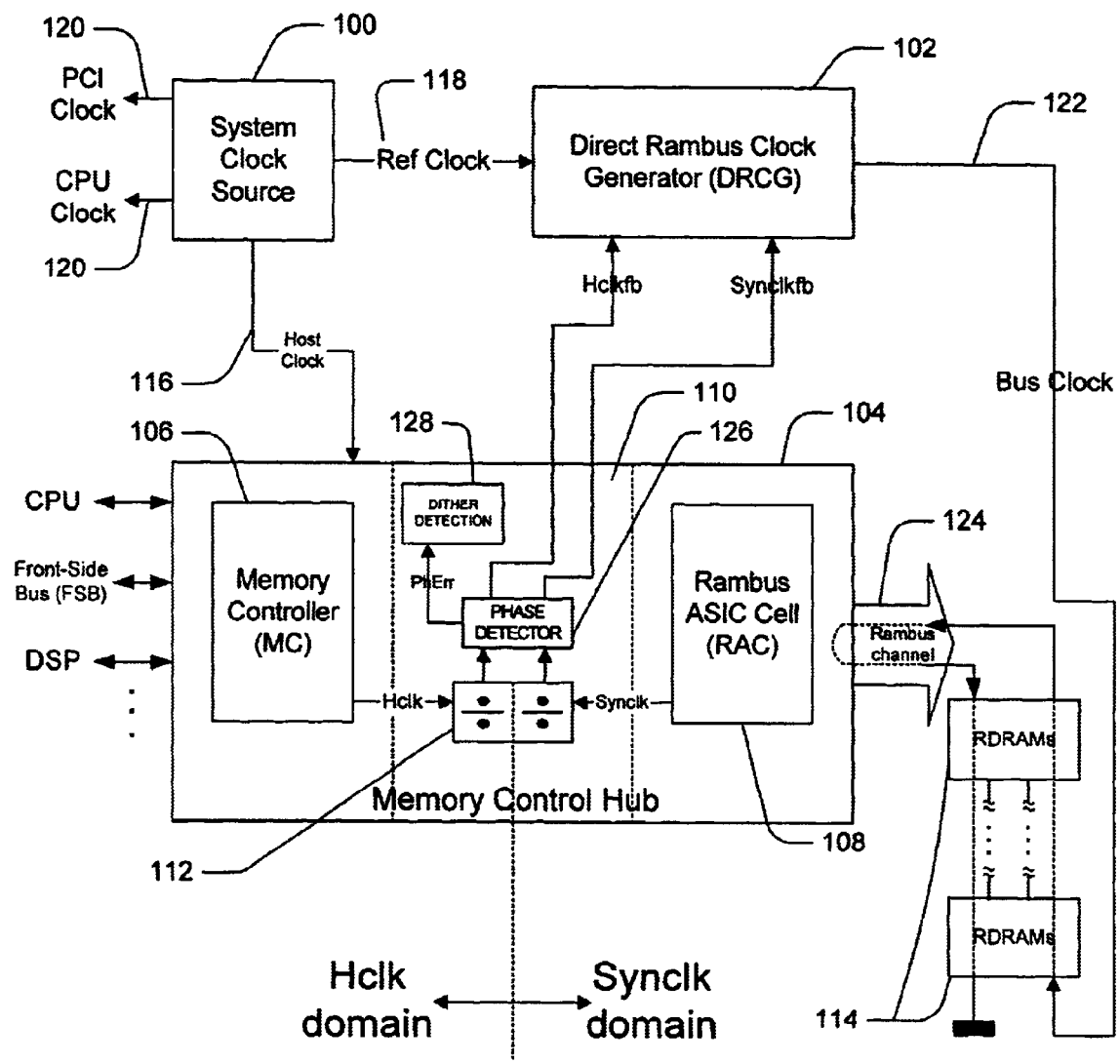
FIG. 1 is a block diagram of the Direct Rambus DRAM (RDRAM) system-clocking configuration.

A block diagram of the Direct Rambus DRAM (RDRAM) system-clocking configuration is shown in FIG. 1. The diagram shows the interconnection of the system clock source 100, the Direct Rambus Clock generator (DRCG) 102, and the clock signals of the Memory Control Hub (MCH) 104. The MCH 104 includes the Rambus Asic Cell (RAC) 108, the Memory Controller (MC) 106, and logic 110 to support synchronizing the Rambus Bus Clock (Busclk) with the controller clock (Hclk).

This configuration achieves frequency-lock between the controller clock (Hclk) and the Rambus Synchronization Clock (Synclk), which is generated from the Busclk through a fixed divide-by-four circuit within the RAC 108. These clock signals (Hclk and Synclk) are matched and phase-aligned to allow data transfers to occur across the MC/RAC boundary with minimal latency. A pair of dividers 112 that divides the frequencies of Hclk and Synclk to the same frequency does the matching.

The MCH 104 further includes a phase detector 126 that receives two signals, Hclk and Synclk. In one embodiment, the phase detector 126 determines which of the two signals is earlier or later in phase. In another embodiment, the phase detector 126 reconstitutes the two signals as a difference signal, PhErr. This difference signal indicates the sign of, the phase relationship of the feedback clocks. In a further embodiment, dither detection logic 128 aligns the Hclk and Synclk using the PhErr signal. The DRCG 102 together with the synchronizing logic 110 enables the MCH 104 to exchange data directly from the Hclk domain to the Synclk domain without incurring additional latency to synchronization.

The system clock source 100 drives the host clock (Hclk) 116, the reference clock (Refclk) 118, and other clocks such as the PCI bus and CPU clocks 120. A phase-locked loop (PLL) inside the DRCG 102 multiplies the DRCG's Refclk 118 input to generate the desired frequency for the Busclk 122.

The Rambus Channel 124 creates an electrical connection between the MCH and the Direct RDRAMs 114. In one embodiment, the operation of the Channel 124 is based on high speed signals that use both edges of 400 MHz clock, creating data transfer rates of 800 Mbits/sec/pin. There are 16 pins for 16-bit (two bytes) operation.

The Rambus Busclk 122 is running at 400 MHz, which allows the Synclk domain to run at 100 MHz. The Hclk domain also runs at 100 MHz. At power up, after being in a low-power mode, the DRCG 102 aligns the Hclk and the Synclk domains. The amount of time it takes for Synclk and Hclk to align depends on the rate that the DRCG 102 can adjust the relative phase and the phase in which the Synclk wakes up with respect to Hclk.

Figure 2:
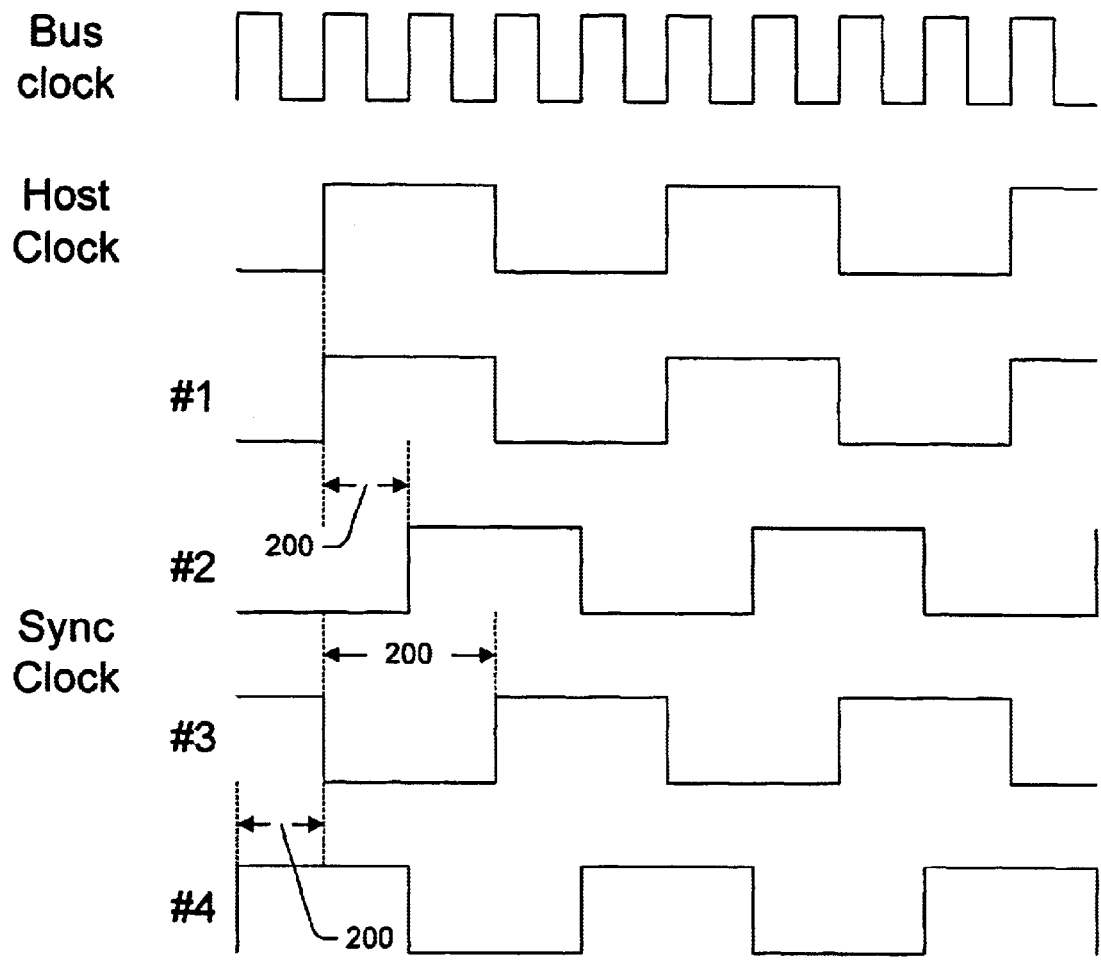
FIG. 2 shows different states of phase offset in which the Synclk can wake up relative to the Hclk.

FIG. 2 shows four primary states of phase-offset 200 in which the Synclk can wake up relative to the Hclk. The Synclk can wake up in any phase, but these four primary phases represent the key phases that determine the number of clock states it will take to phase align in the two clocks. Starting at state #2, each state is offset by one Busclk cycle from the previous state. The amount of time it takes the DRCG 102 to phase align the offset between the Hclk and the Synclk is a function of the phase error, the minimum time step of the DRCG (approximately 2 picoseconds), and the DRCG update rate (40 nanoseconds between steps for 25 MHz operation).

For example, in the embodiment described above, if the system wakes up in a state in which the Hclk and the Synclk are almost phase aligned (state #1) except for the clock drift of about 200 picoseconds, the DRCG 102 could align the offset within about 4 microseconds ([200 pS/2 pS]×40 nS). The states #2 and #4 are offset by one Busclk cycle (2.5 nS). This would take about 50 microseconds to align. However, if the Hclk and the Synclk wake up in the largest phase offset, in which the phase is offset by a maximum amount of 2 Busclk cycles (state #3), the phase alignment process could take as much as 100 microseconds or more.

Since the Direct RDRAM system cannot transition into a power-up mode from a low-power mode or a power-down mode until the clocks are aligned and operating, it is advantageous to force the phase offset of the clocks into a minimum offset configuration, such as in state #1, before starting the phase alignment process. In one aspect, shown in FIG. 3, a Sync Pulse signal 300 generated in the. RAC 108 is used to determine if the phase of the Synclk should be stalled to force the offset into a minimum.

Figure 4:
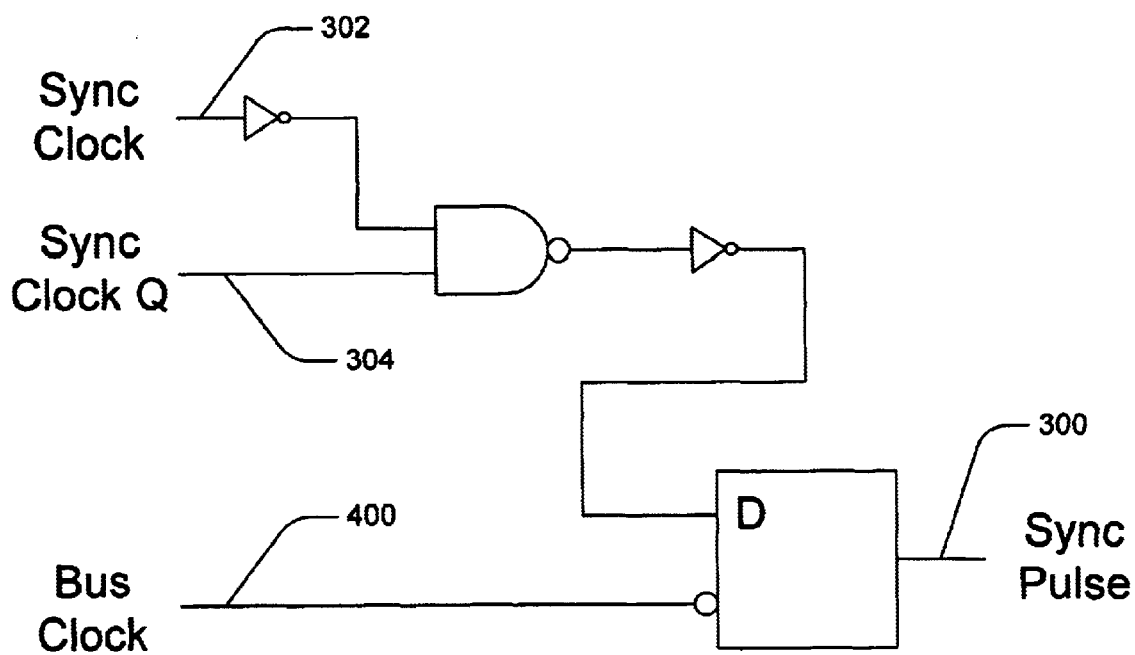
FIG. 4 is a schematic diagram of the Sync Pulse generation circuit.

The Sync Pulse signal 300 (see FIG. 4) is generated by the Synclk signal 302 and a Synclk-Q signal 304, which is normally output from the RAC 108 and leads the Synclk signal 302 by 90 degrees in phase. The Sync Pulse signal 300 is set when the Synclk signal 312 is low and the Synclk-Q signal 304 is high, and is triggered by a falling edge of the Busclk signal 400. Therefore, the Sync Pulse signal 300 is set exactly one-half Busclk 400 cycle before the rising edge of the Synclk signal 312. The Sync Pulse signal 300 is reset on the next falling edge of the Busclk signal 400, which is one-half Busclk 400 cycle after the rising edge of the Synclk signal 312.

Figure 3:
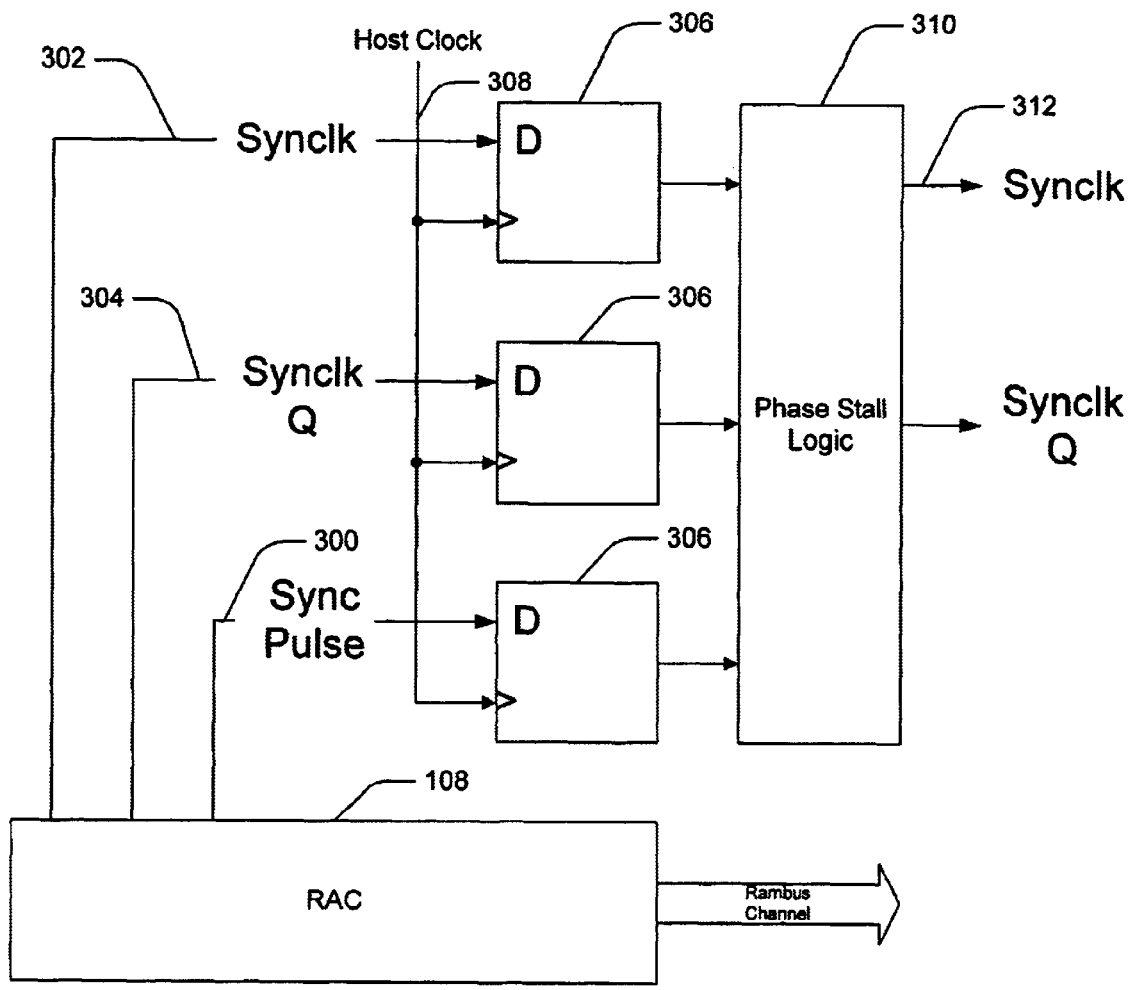
FIG. 3 is a schematic diagram of the Synclk phase stall logic.

Referring to FIG. 3, the three signals (Synclk, Synclk-Q, and Sync Pulse) are sampled into the flip-flops 306 by the Hclk signal 308. If the sampled Sync Pulse signal 300 is set, the Synclk 302 and the Hclk 308 signals are within one-half Busclk cycle. In this case, the phase stall logic 310 passes the Synclk 302 and the Synclk-Q 304 signals through without stalling the phase. However, if the sampled Sync Pulse signal 300 is not set, the phase stall logic 310 analyzes the three signals 300, 302, 304 to determine whether to insert phase stall by asserting PhStall to the RAC 108 to delay the Synclk pulse 312 by one Busclk.

Figure 5:
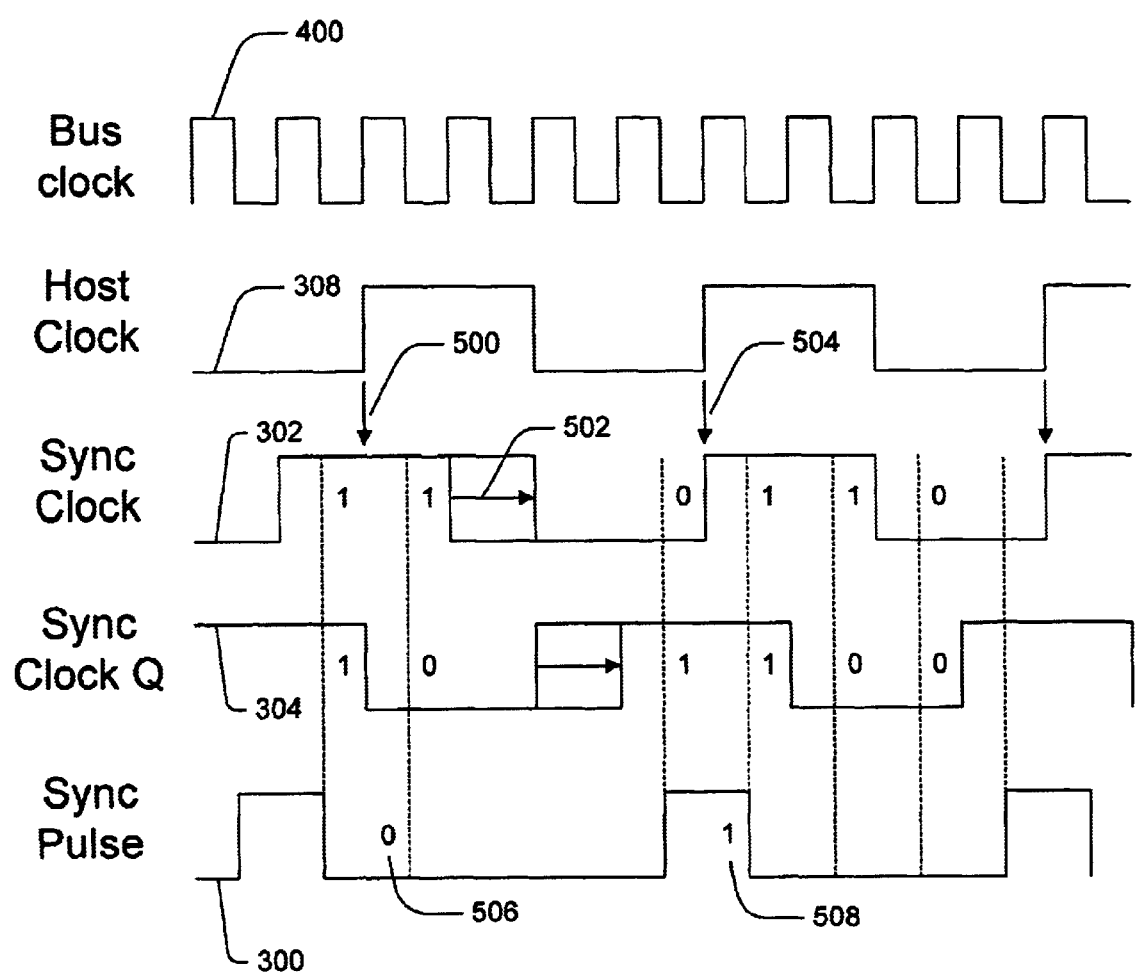
FIG. 5 is a timing diagram showing the Synclk phase stall process relative to the Hclk.

FIG. 5 is a timing diagram of the Hclk 308 along with the Busclk 400 and the three signals 300, 302, 304 (Synclk, Synclk-Q, and Sync Pulse) mentioned above. The diagram also shows the Synclk 302 phase stalling process 502. When the signals are initially sampled 500 by the Hclk 308, the Sync Pulse signal 300 is not set 506 and the Synclk 302 and Synclk-Q 304 signals indicate the phase offset of one Busclk 400 cycle (i.e. Synclk is set and Synclk-Q is reset). The phase stall logic extends 502 the logic high time of the Synclk 302 by one Busclk 400 cycle.

On the next sampling of the signals by the Hclk at 504, the Sync Pulse signal 300 is set at 508. Since the rising edge of the Synclk 302 falls at a midpoint. of the Sync Pulse signal 300, sampling of the Sync Pulse signal 300 by the Hclk 308 assures that the phase offset between the Hclk 308 and the Synclk 302 is at a minimum, which is less than one-half of the Busclk cycle. The phase stalling process 502 could be repeated for a phase offset of two Busclk 400 cycles.

When the Hclk 308 is sampling the signals, if the Hclk 308 becomes exactly aligned with one of the edges of these signals, then that particular sample may result in an output that will resolve itself as either one or zero. This is a meta-stable state in which the MC 106 will not be able to resolve the timing offset without further inquiry of signals other than the Sync Pulse signal 300. However, the sampling guarantees that two out of three signals (Sync Pulse, Synclk, Synclk-Q) will be valid since they are separated by a time duration that is sufficient to insure valid sampling. Therefore, if the Sync Pulse signal 300 is logic one, then the process is done. But if the Sync Pulse signal 300 is a logic zero, then the other two signals have be processed to resolve the offset.

Figure 6:
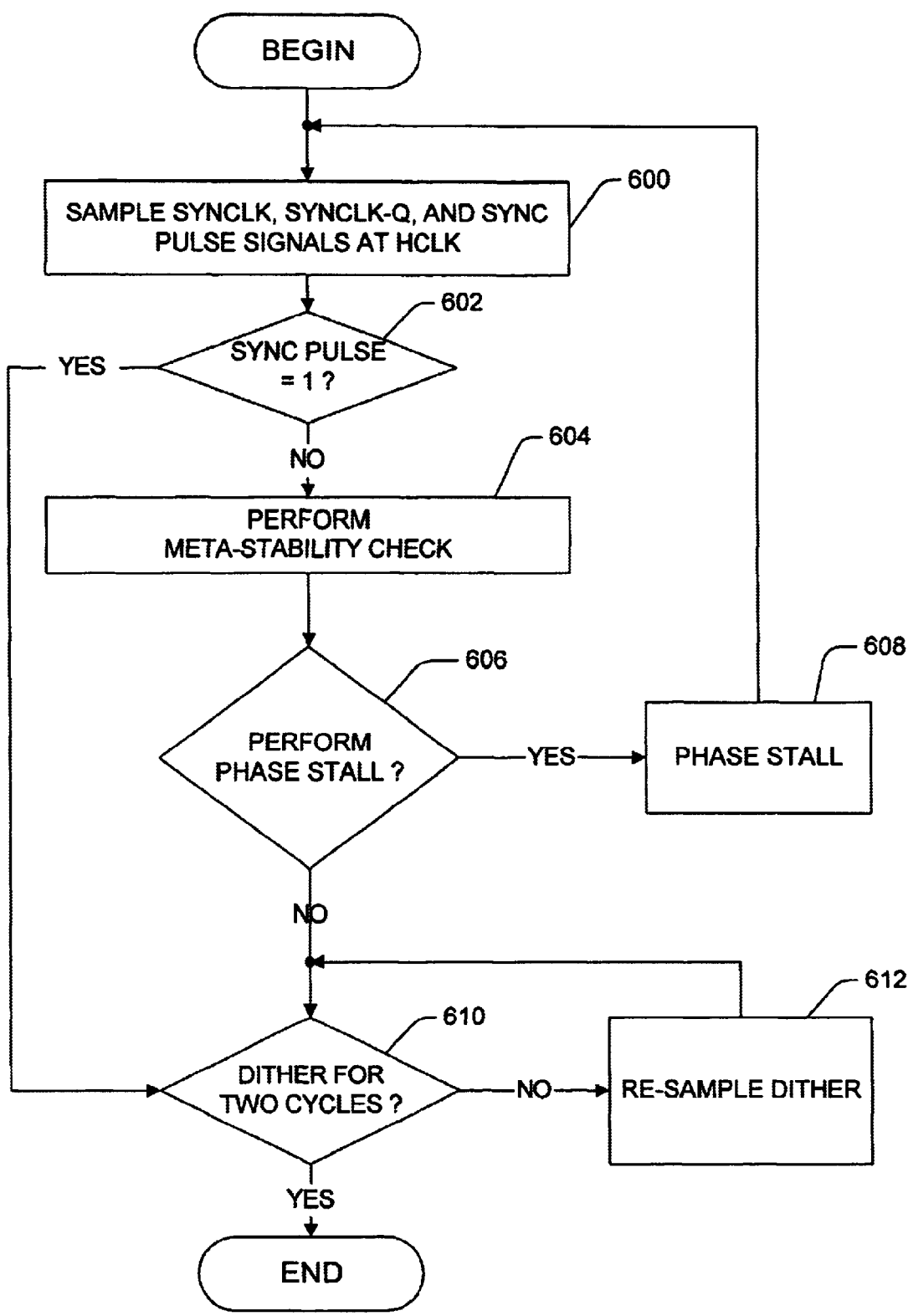
FIG. 6 is a flow diagram of the phase stall and dither logic.

A flow diagram of the phase stall,and dither detection logic, resident in the MCH 104, is illustrated in FIG. 6. The phase stall logic forces the phase offset of the Synclk and the Hclk into a minimum offset of one-half Busclk cycle.

In one embodiment, the dither detection logic monitors output of the phase detector 126 for dithering, which manifests itself as a series of alternating clock leads and lags. When the clocks are not aligned, the phase detector outputs consecutive lags or leads. However, when the clocks are substantially aligned, the phase detector output provides alternating cycles of clock leads and lags (dithering). Therefore, the dither detection logic enables the system to enter the power-up mode quicker when the offset is much smaller than the maximum one-half Busclk cycle.

In another embodiment, the dither detection logic monitors a difference signal called PhErr defined in FIG. 1. The signal indicates the sign of the phase relationship of the feedback clocks. The PhErr signal changes sign in a set time period when a dither is detected. If no sign change is detected by the dither detection logic, the DRCG 102 is still adjusting the phase and it has not yet reached a point that it could be called in sync.

The phase stall and dither detection logic begins by sampling the Sync Pulse signal, along with the Synclk and Synclk-Q signals, at the rising edge of the Hclk (step 600). If the Sync Pulse signal is not set (step 602), the phase stall logic performs meta-stability check at step 604. This check involves verifying the states of the Synclk and Synclk-Q signals. Otherwise, if the Sync Pulse signal is set, the initial alignment is done. The process can proceed to look for dithering at step 610.

In one embodiment, when the RAC powers up, Synclk, Synclk-Q, and Sync Pulse signals are in known phases, relative to one another (step 606). However, the relative phases are unknown to Hclk. The meta-stability check can be accomplished for any edges of Synclk, Synclk-Q, or Sync Pulse that line up exactly with Hclk. If Synclk, Synclk-Q, and Sync Pulse-signals do not line up on the Hclk edge, phase stalling (PhStall) the RAC results in Sync Pulse being asserted to logic one in three phase stalls or less. The coarse alignment is done at this point.

Since Synclk and Synclk-Q signals are output on positive edges and Sync Pulse on a negative edge of the Busclk, eight edges are of interest in the divide-by-four counter output. When the edges of interest are evaluated with Hclk, the signals can be tabulated as follows:

TABLE 1

| Edge No. | Synclk/ Synclk-Q/ Sync Pulse | PhStall No. | Synclk/ Synclk-Q/ Sync Pulse | PhStall No. | Synclk/ Synclk-Q/ Sync Pulse | PhStall No. | Synclk/ Synclk-Q/ Sync Pulse |
|---|---|---|---|---|---|---|---|
| 1 | 0 1 0 | 1 | 0 0 0 | 2 | 1 0 0 | 3 | 1 1 0 |
| 2 | 0 X 0 | 1 | X 0 0 | 2 | 1 X 0 | 3 | X 1 1 |
| 3 | 0 0 0 | 1 | 1 0 0 | 2 | 1 1 0 | 3 | 0 1 0 |
| 4 | X 0 0 | 1 | 1 X 0 | 2 | X 1 1 | | |
| 5 | 1 0 0 | 1 | 1 1 0 | 2 | 0 1 0 | | |
| 6 | 1 X 0 | 1 | X 1 1 | | | | |
| 7 | 1 1 0 | 1 | 0 1 0 | | | | |

X = don't care state

Figure 7A:
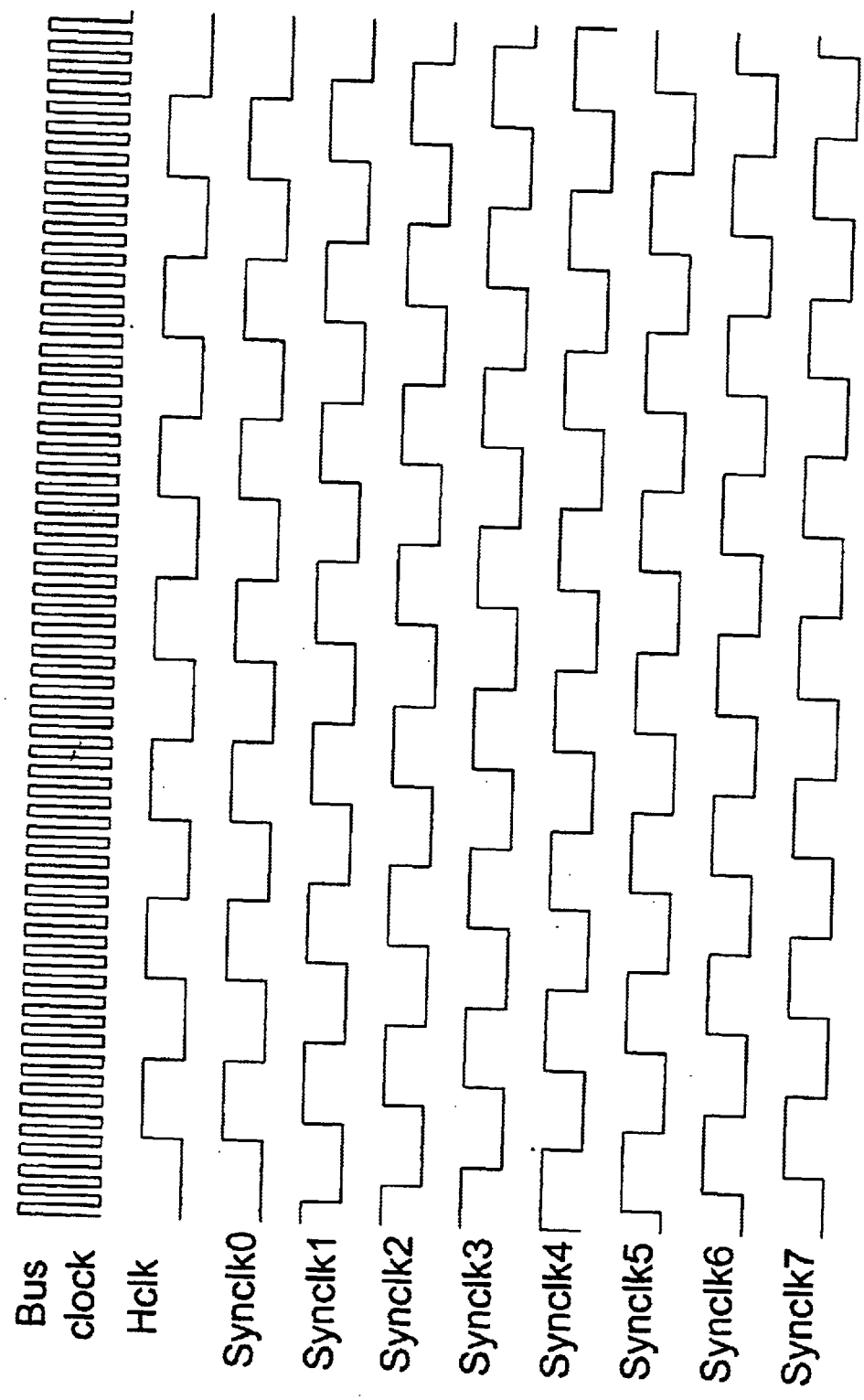
FIG. 7A illustrates eight edges of interest in the Synclk signal relative to the Hclk signal.

FIG. 7A illustrate all eight edges of interest in the Synclk signal. In the Table 1 above, the Synclk signal is referenced to the Hclk signal edge for the edges of interest. For example, the edge number 0 lines up Synclk exactly with Hclk. The Sync Pulse signal would be substantially centered and the alignment is done. The edge number 1 places Synclk one-eighth of phase offset to Hclk.

Figure 7B:
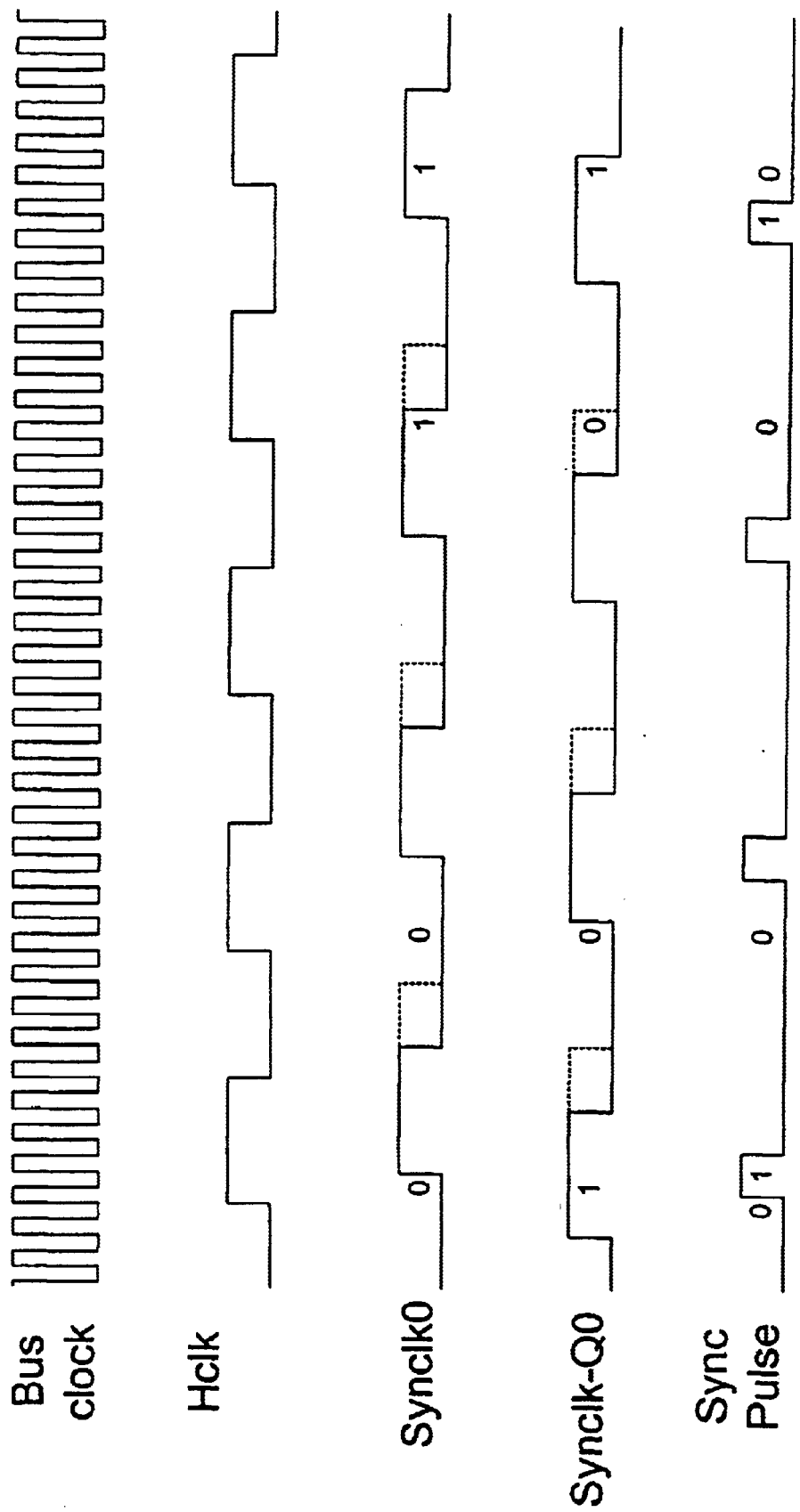
FIG. 7B shows phase stalling process for edge number one.

For odd edge numbers, Synclk and Synclk-Q signals are always valid. Thus, a predictable pattern emerges. For example, if the phase stall starts at edge number 1 (see FIG. 7B and Table 1 above), three phase stalls push Synclk to edge number 7. Synclk is within one-half Busclk cycle of Hclk and the coarse alignment is done. Edge number 3 pushes to edge number 5, and then to edge number 7. Again, Synclk is within one-half Busclk cycle of Hclk and the coarse alignment is done. Edge number 5 pushes to edge number 7, and the alignment is done. Edge number 7 pushes to edge number 1, and the alignment is done.

Edge number 1 has to push the Synclk signal around the diagram to edge number 7 because otherwise if the signal is left alone it would be indistinguishable from edge number 2. In that configuration, the signal could be off one Busclk cycle. This is also true for other edge numbers.

For even edge numbers, the Synclk signal always gets pushed to a position where the Sync Pulse is at logic one. The coarse alignment is done at this point.

The above meta-stability check is an illustrative example. The check can be performed by monitoring the different combinations of Sync Pulse, Synclk, and Synclk-Q signals.

When the phase offset is forced into a minimum by a phase stall logic, the Direct RDRAM system counts out the maximum phase alignment time for the DRCG to align the one-half Busclk cycle offset before starting up the system again. This alignment process could take between 4 and 25 microseconds ([1.25 nS/2 pS]×40 nS) depending on the actual phase offset. However, the offset is often much less than the maximum one-half Busclk cycle with only contribution to the offset being the 200 picosecond clock drift. Therefore, it is advantageous to determine if the system can be started before the maximum phase alignment time of 25 microseconds. This is accomplished by monitoring the Busclk and the Hclk output phase detector for dithering, at step 610. If the output of the phase detector dithers or oscillates for at least two cycles, then the dither detection logic determines that the clocks are substantially phase aligned and the system can be released for normal operation. Otherwise, the phase detector output is re-sampled, at step 612, for dither.

The phase stall process and the dither detection process, described above for FIG. 6, indicate that a valid data can be sampled at any time by monitoring the three signals: the Sync Pulse signal, the Synclk signal, and the Synclk-Q signal. The dither detection enables fast fine alignment.

A computer program residing on a computer readable medium can implement the phase stall and dither detection process. The program comprises executable instructions that enable the Direct RDRAM system to phase stall the Synclk and the Synclk-Q signals to force the phase,offset between the Hclk and the Synclk into a minimum for fast re-synchronization of the clocks.

Figure 8:
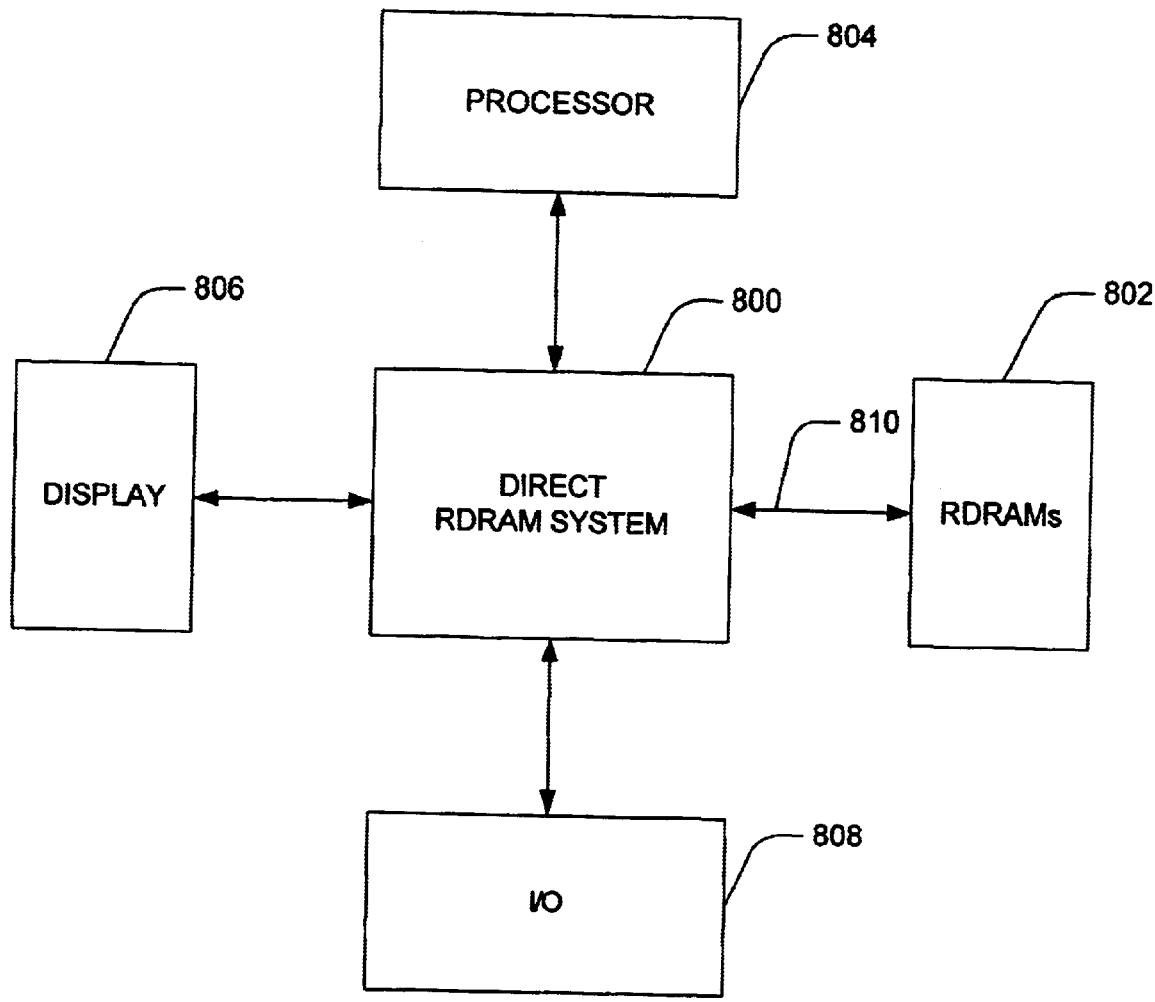
FIG. 8 is a block diagram of a computer system having a Direct RDRAM system.

FIG. 8 is a block diagram of a computer system having a Direct RDRAM system 800. The RDRAM system 800 enables a fast start-up of the computer system by providing a fast method of aligning domain clocks. The RDRAM system 800 incorporates phase stall logic to roughly align the domain clocks before performing a fine alignment. In some embodiments, the rough alignment process can take up to 25 microseconds. It also incorporates a dither logic to start the computer system up as soon as the fine alignment is done. The computer system also includes processors 804, a display 806, I/O devices 808, and RDRAMs 802, which connect to the RDRAM system 800 through the Rambus Channel 810;

Other embodiments are within the scope of the following claims. For example, the above description shows bus-clock at 400 MHz and Synclk and Hclk at 100 MHz. However, other frequencies and frequency ratios between Synclk and Hclk can be handled with appropriate adjustments to the dividers 112. Any frequency combination that can be handled in an RDRAM system can be accommodated by this method. For example, for bus frequencies that are not the same, the alignment scheme will align particular Hclk edges with Synclk. Thus, for 133 MHz Hclk and 100 MHz Synclk, Hclk and Synclk align on the first and third Synclk edges. The state machine would know this gear ratio and can sample on every Hclk. However, the captured Synclk, Synclk-Q and Sync Pulse signals are evaluated only on the Hclk of interest.

Further, to reduce the severe penalty paid for waiting out the maximum count during phase alignment before powering the system up, an early-phase Hclk can be gated into the Synclk feedback path to initialize the divide-by-four circuit in the RAC after a "nap" or power-down mode.

What is claimed is:

1. A method for aligning domain clocks to enable relatively fast start-up of a system, comprising:
   prior to a dependent clock generation loop, determining a phase offset between a first domain clock and a second, independent domain clock using a sync pulse;
   phase stalling one of the domain clocks and pushing edges of said domain clocks into a pulse width of said sync pulse;
   fine aligning the domain clocks; and
   issuing a signal when said fine alignment is finished.

2. The method of claim 1, wherein said determining a phase offset includes sampling said sync pulse that indicates a location of one of said domain clocks relative to the other said domain clock.

3. The method of claim 2, wherein said sync pulse is sampled at a rising edge of said first domain clock.

4. The method of claim 1, wherein phase stalling includes repeatedly adjusting a pulse width of said first domain clock to force said first domain clock into a rough alignment with said second domain clock.

5. The method of claim 1, wherein said phase stalling forces said domain clocks into a minimum offset configuration by aligning said domain clocks to within a fraction of a reference clock cycle.

6. The method of claim 5, wherein said pulse width of said sync pulse is one reference clock cycle wide.

7. The method of claim 6, wherein rising edges of said domain clocks are at a midpoint of said sync pulse.

8. The method of claim 7, wherein said act of aligning aligns said domain clocks to less than one-half of said reference clock cycle.

9. The method of claim 1, further comprising:
   detecting dithering of said domain clocks; and
   immediately placing the system into a full-power mode.

10. The method of claim 9, wherein said act of placing sets the system into the full-power mode after at least two cycles of dithering are detected.

11. A method for re-synchronizing domain clocks after waking up from a reduced-power mode, comprising:
   prior to a dependent clock generation loop sampling a sync pulse that indicates a location of a first domain clock relative to a second domain clock, said sampling synchronized with rising edges of the first domain clock;
   performing meta-stability check;
   phase stalling the second domain clock by one clock cycle of a reference clock if said meta-stability check indicates that the domain clocks are offset in phase;
   repeating said sampling and said phase stalling until the sampled sync pulse indicates that the domain clocks are phase aligned to within a fraction of the reference clock; and
   phase aligning the domain clocks.

12. The method of claim 11, wherein phase stalling includes adjusting a pulse width of said second domain clock to force the clock into a rough alignment with the first domain clock.

13. The method of claim 11, wherein a pulse width of said sync pulse is one reference clock cycle wide.

14. The method of claim 13, wherein rising edges of said domain clocks are at a midpoint of said sync pulse.

15. The method of claim 14, wherein said first and second domain clocks are aligned to less than one-half of the reference clock cycle.

16. The method of claim 11, wherein said performing meta-stability check includes determining if said first domain clock edge is substantially aligned with said second domain clock edge, where stability of said sync pulse is ambiguous.

17. The method of claim 16, wherein said performing meta-stability check further includes determining logic states of said sync pulse signal, said second domain clock, and a third domain clock that is phase offset from said second domain clock by 90 degrees.

18. The method of claim 17, wherein said performing meta-stability check by said first domain clock enables valid sampling of signals.

19. An apparatus comprising a computer-readable storage medium having executable instructions that enable the computer to:
   prior to execution of a dependent clock generation loop, determine a phase offset between at least two independent domain clocks using a sync pulse;
   force the domain clocks in such a configuration into a minimum phase offset configuration by phase stalling one of the domain clocks and pushing edges of the domain clocks into a pulse width of the sync pulse;
   fine align the domain clocks, and issuing a signal when the alignment is finished; and
   power the system up in response to said signal.

20. A circuit for quickly re-synchronizing domain clocks to enable fast system start-up, comprising:
   a sampling circuit configured to, prior to a dependent clock generation loop, sample a first domain clock at a rising edge of a second, independent domain clock and to indicate a phase offset between the first and second domain clocks;
   a phase stalling circuit coupled to the sampling circuit, and configured to extend logic high time of the second domain clock, such that the phase offset is pushed into a minimum offset configuration.

21. The circuit of claim 20, further comprising:
   a phase aligning circuit configured to fine align the domain clocks; and
   a dithering detector operating to detect dithering in the domain clocks after fine alignment, said dithering detector outputting a signal to bring the system up to a normal power mode when dithering is detected for some period of time.

22. The circuit of claim 21, wherein said some period of time is at least two cycles of dithering.

23. A random-access memory system interfacing with processors, and enabling fast computer system start-up, comprising:
   a common bus operating with a plurality of domain clocks;
   a clock generator operating to generate a high frequency bus clock, said clock generator configured to detect and fine align phase offset between said plurality of domain clocks;
   a random-access memory array coupled to one end of the common bus, said memory array being accessed with said high frequency bus clock; and
   a memory controller coupled to the processors and the memory array through the common bus and enabling fast access of the memory array by the processors, said memory controller having a fast re-synchronizing circuit configured to, prior to a dependent clock generation loop, sample a first domain clock at a rising edge of a second independent domain clock, said sampling indicating a phase offset between the first and second domain clocks, said re-synchronizing circuit operating to extend the logic high time of the second domain clock, such that the phase offset is pushed into a minimum offset configuration.

24. The system of claim 23, further comprising:

a dithering detector operating to detect dithering in the domain clocks after fine alignment, said dithering detector outputting a signal to bring the computer system up to a normal power mode when dithering is detected for some period of time.

25. The system of claim 24, wherein said some period of time is at least two cycles of dithering.

26. A circuit for fast re-synchronization of multiple independent domain clocks after power-down to enable fast systems startup, comprising:

a first domain clock and a second, independent domain clock used for data transfer;

a clock divider configured to receive said first and said second clocks and output a processed first-clock and a processed second clock;

a phase detector coupled to said processed first and second clocks and configured to output a phase error; and phase offset circuitry configured to minimize said phase error between said processed first and second clocks by stalling one of said clocks and pushing edges of said clocks into a pulse width of said synch pulse prior to phase alignment with dependent clock generation circuitry.

27. The circuit of claim 26, wherein the phase offset circuitry includes:

circuitry for course alignment of said clocks; and circuitry for fine alignment of said clocks.

* * * * *